United States Patent [19]

Sugawara

[11] 4,286,280
[45] Aug. 25, 1981

[54] SEMICONDUCTOR INTEGRATED CIRCUIT DEVICE

[75] Inventor: Yoshitaka Sugawara, Hitachi, Japan

[73] Assignee: Hitachi, Ltd., Tokyo, Japan

[21] Appl. No.: 91,707

[22] Filed: Nov. 6, 1979

[30] Foreign Application Priority Data

Nov. 8, 1978 [JP] Japan ................. 53-136724

[51] Int. Cl.³ ............... H01L 27/04; H01L 27/12
[52] U.S. Cl. ........................... 357/50; 357/49; 357/59; 357/38
[58] Field of Search ............. 357/50, 49, 59, 38

[56] References Cited

U.S. PATENT DOCUMENTS

| 3,648,128 | 3/1972 | Kobayshi | 317/235 R |
|---|---|---|---|
| 3,858,237 | 12/1974 | Sawazoki | 357/49 |
| 3,871,007 | 3/1975 | Wakamiya | 357/59 |
| 3,905,037 | 9/1975 | Bean | 357/49 X |
| 3,956,034 | 5/1976 | Nicolay | 357/49 X |
| 3,961,356 | 6/1976 | Kooi | 357/50 |
| 4,009,484 | 2/1977 | Oguie | 357/50 X |
| 4,089,021 | 5/1978 | Sato | 357/20 |
| 4,146,905 | 3/1979 | Appels | 357/59 X |
| 4,157,269 | 6/1979 | Ning | 148/1.5 |
| 4,188,707 | 2/1980 | Asano | 29/571 |

Primary Examiner—Martin H. Edlow
Attorney, Agent, or Firm—Craig and Antonelli

[57] ABSTRACT

A semiconductor integrated circuit device including a power element and circuit elements for controlling the power element each provided on the same dielectric isolated substrate is disclosed in which the dielectric isolated substrate comprises a semiconductor monocrystalline region extending from one principal surface of the dielectric isolated substrate to the other principal surface, a plurality of semiconductor monocrystalline islands each exposed in a part thereof to the above-mentioned one principal surface, a semiconductor polycrystalline region for supporting the monocrystalline region and the monocrystalline islands, and an insulating film provided among the polycrystalline region and the monocrystalline islands and region; and in which the power element is formed in the monocrystalline region and the circuit elements for controlling the power element are formed in the monocrystalline islands.

9 Claims, 10 Drawing Figures

SEMICONDUCTOR INTEGRATED CIRCUIT DEVICE

The present invention relates to a semiconductor integrated circuit device (hereinafter referred to as an IC), and more particularly to an IC having a high breakdown voltage and a large current capacity.

As the application field of IC's has been remarkably spread in recent years, it is required that IC's have various kinds of high-degree functions. Specifically, in the field of household electric appliances, business machine, or industrial machinery and apparatus, a power IC of low cost is greatly desired which has a breakdown voltage of more than 100 V and a current capacity of more than 1 A, and which is compatible with a transistor-transistor-logic (TTL).

At present, a hybrid IC is employed in place of the above power IC, but a monolithic IC corresponding to the hybrid IC is greatly desired since the hybrid IC has the following drawbacks. (1) It is difficult to fabricate a hybrid IC of high packing density, and the cost of the hybrid IC cannot be made lower than a certain limit. (2) The hybrid IC cannot be made smaller in size and weight than a certain limit because of difficulty in fabricating the hybrid IC of high packing density. (3) The hybrid IC is inferior in reliability since it includes a large number of connecting points.

A conventional monolithic IC does not have a high performance, a high breakdown voltage and a large current capacity such as described above. In more detail, a junction-isolated type IC is large in leakage current and parasitic effect, and moreover it is hard to include in this IC both a power element and low-power elements for controlling the power element. While, a dielectric-isolated type IC is preferably with respect to the above points, as is shown in an article entitled "The Status of Monolithic and Thin Film Circuits", Electronic Industries, Vol. 24, No. 6, June 1965, pp. 38 to 42, and is put into practical use as an IC having a high breakdown voltage. However, the dielectric-isolated type IC is unsatisfactory in current capacity and packing density for the following reasons.

(1) A dielectric layer and a semiconductor polycrystalline region (hereinafter referred to as a polycrystalline region) are interposed between a heat sink and a power element formed in a semiconductor monocrystalline island (hereinafter referred to as a monocrystalline island). As a result, the dielectric-isolated type IC is inferior in heat dissipation to a vertical-type discrete element and cannot achieve a large current capacity.

(2) The thickness of the monocrystalline island has to be determined taking into account an element of high breakdown voltage, in order to prevent the breakdown voltage from being affected by defects in an interface between the dielectric layer and the monocrystalline island. For example, the above thickness is made larger than the width of depletion layer when the breakdown voltage is applied. As a result, a monocrystalline island including therein a control element of low breakdown voltage is obliged to have a thickness more than a required value. In the case where the thickness of the island is large, it is required to make large apertures of a mask for etching in forming isolating grooves, and therefore the packing density is decreased. In general, the number of elements which are included in an IC, and which have low breakdown voltages, and make up a control circuit, is greater than that of elements which are included in the same IC and have high breakdown voltages. Therefore, the reduction in packing density caused by the enlargement of island thickness is very great.

(3) Terminals of an element having a high breakdown voltage are provided on the same principal surface of the IC. Accordingly, these terminals have to be kept apart from each other by a distance corresponding to the breakdown voltage of the element (for example, by a distance more than the width of depletion layer at a time when the breakdown voltage is applied). As a result, the element having a high breakdown voltage occupies a larger area in the principal surface of the IC as compared with a vertical-type element.

(4) Some of the carriers in the IC are recombined with each other through defects in the interface between the dielectric layer and the monocrystalline islands and are extinguished, and thus cannot perform any effective operation. As a result, the forward voltage drop (FVD) of a diode or thyristor is increased, the on-resistance of the transistors is increased, and the current amplification factor of the transistors is reduced. These give rise to an increase in power loss and a decrease in current capacity. Specifically, in the case of the thyristor which is obliged to have a lateral structure, many carriers are lost in the bulk in addition to the carriers extinguished in the above-mentioned interface. Accordingly, in the above thyristor, the forward voltage drop (FVD) is remarkably increased, that is, the power loss is greatly increased, as compared with the case of a vertical-type element.

An object of the present invention is to provide a semi-conductor integrated circuit device having a high breakdown voltage and a large current capacity.

Another object of the invention is to provide a semiconductor integrated circuit device which includes both a power element provided in a main circuit and low-power elements for controlling the power element.

A further object of the present invention is to provide a semiconductor integrated circuit device which includes a power element excellent in heat dissipation.

Still another object of the present invention is to provide a semiconductor integrated circuit device which includes an element having a high breakdown voltage and moreover is high in packing density.

A still further object of the present invention is to provide a semiconductor integrated circuit device which is small in power loss.

A feature of the present invention resides in that a planar or lateral element having a small current capacity and a vertical-type element having a high breakdown voltage and a large current capacity are formed in a single dielectric-isolated substrate through both the dielectric isolation technique and the junction isolation technique to form a monolithic integrated circuit.

In a monolithic IC according to the present invention, an element having a large current capacity is formed as a vertical-type element, and one main electrode thereof is fixed to and directly coupled with a heat sink. Accordingly, the element is excellent in heat dissipation and small in power loss, as compared with a lateral-structure element, and therefore a large current capacity is permitted. Further, since the above element of high current capacity is a vertical-structure element, it can withstand a high applied voltage by adjusting or modifying its structure in the vertical direction, and moreover the high breakdown voltage thus obtained is not affected by the structure of the element in the lateral direction. Accordingly, it is possible to reduce the area occupied by the element of high breakdown voltage in the principal surface of the monolithic IC, and therefore the packing density can be improved.

Further, in the monolithic IC according to the present invention, the thickness of a monocrystalline island in which an element of low breakdown voltage is formed, can be determined independently of the element of high breakdown voltage. Accordingly, it is possible to make small an aperture of mask for etching in forming isolating grooves, and therefore the packing density can be enhanced.

The above and other objects, features and advantages of the present invention will be made apparent by the following description taken in conjunction with the accompanying drawings, in which.

Figure 1:
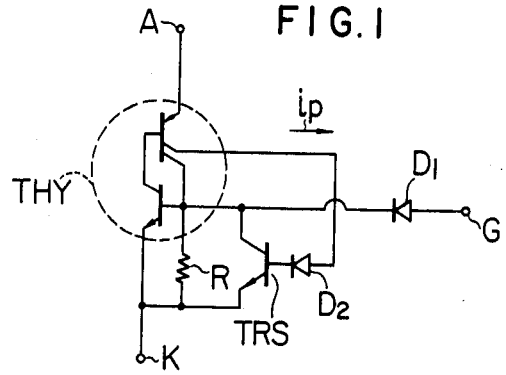
FIG. 1 is a circuit diagram of a switching circuit employing a thyristor.
Figure 2:
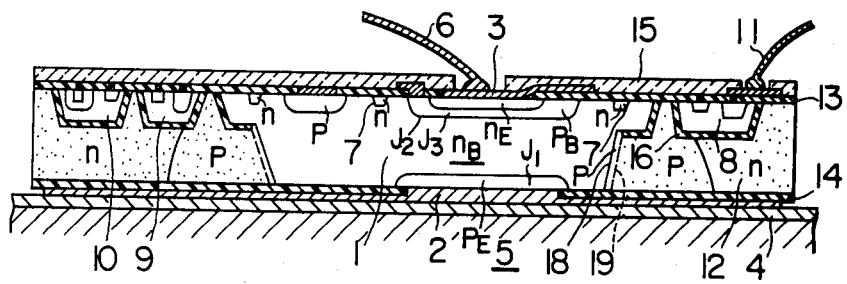
FIG. 2 is a longitudinal sectional view of a semiconductor integrated circuit device in which the switching circuit shown in FIG. 1 is formed in accordance with the present invention.

FIG. 1 shows the circuit arrangement of the semiconductor integrated circuit device of the present invention shown in FIG. 2. This circuit arrangement can achieve a high breakdown voltage (more than 200 V) and a high dV/dt capability (more than 1000 V/$\mu$s), and the operation thereof is as follows. Referring to FIG. 1, a resistor R having a high resistance and a transistor TRS are connected between a gate and a cathode K of a thyristor THY, and the transistor TRS is usually put in the off-state (non-saturated state). Accordingly, when the thyristor THY is applied with a gate signal from a terminal G through a diode $D_1$ in a state that a forward voltage is applied between the anode A and the cathode K of the thyristor THY, the thyristor THY is fired. The thyristor THY can be turned off by making a current flowing through the thyristor THY smaller than a holding current, or by reducing the applied voltage.

In general, when a forward voltage of a rapid rise dV/dt is applied between the anode and the cathode of a thyristor put in the off-state, a displacement current flows from the $n_B$-layer of four layers $p_E$, $n_B$, $p_B$ and $n_E$ which constitute the thyristor, into the $p_B$-layer, and the erroneous firing of the thyristor takes place, (in other words, the thyristor is fired without being applied with any gate signal). However, in the switching circuit shown in FIG. 1, a current $i_p$ resulting from the application of the forward voltage of rapid rise flows from the $n_B$-layer to the base of the transistor TRS through a diode $D_2$ to put the transistor TRS in the saturated state, and thus the gate and the cathode of the thyristor THY are shortcircuited. Accordingly, the displacement current flowing into the $p_B$-layer flows through the transistor TRS to reach the cathode K, and therefore the thyristor THY does not suffer from the erroneous firing. In the case where a forward voltage of a slow rise is applied to the thyristor THY and the current $i_p$ based upon this applied voltage cannot put the transistor TRS in the saturated state, but the displacement current flowing into the $p_B$-layer of the thyristor THY flows through the resistor R and then reaches the cathode K. The phenomenon that a thyristor is erroneously fired by the application of a forward voltage of a rapid rise dV/dt is called the rate effect, and a limit below which the erroneous firing never takes place, is called the dV/dt capability. Incidentally, a US Pat. No. 4,015,143 discloses various circuits which are similar to the switching circuit shown in FIG. 1.

The above switching circuit can be made in the form of an embodiment of the present invention in the following manner. Referring to FIG. 2, the thyristor THY is formed with a vertical-structure in a monocrystalline region 1 which is extended between the principal surfaces of a semiconductor substrate, and includes four layers $p_E$, $n_B$, $p_B$ and $n_E$ arranged in the ordered described when viewed from a heat sink 5. The $p_E$- and $n_E$-layers are kept in low-resistive contact with Al electrodes 2 and 3, respectively. The anode electrode 2 made of Al is coupled with the heat sink 5 through a solder 4, and the cathode electrode 3 made of Al is connected through a lead wire 6 to a lead pin (not shown) which is fixed to the heat sink 5 but insulated therefrom. The diodes $D_1$ and $D_2$ are formed in monocrystalline islands 8 and 9, respectively, and the transistor TRS and the resistor R are formed in a monocrystalline island 10. Each of these elements $D_1$, $D_2$, TRS and R has a lateral structure. A lead wire 11 for the gate signal is connected to a lead pin (not shown) different from the lead pin connected to the lead wire 6, to be further connected to an external circuit, a power supply, and the like. The principal surfaces of the semiconductor substrate are coated with $SiO_2$ films 13 and 14, respectively, and the upper principal surface provided with an Al wiring for connecting the elements is further coated with a second passivation film 15 made of sputtered $SiO_2$, $Si_3N_4$, polyimide, or the like. Each monocrystalline island is isolated or insulated from a polycrystalline region 12 by an $SiO_2$ film 16, and the monocrystalline region 1 where the thyristor THY is formed, is isolated from the polycrystalline region 12 by both the $SiO_2$ film 16 and a pn junction 18 formed in the monocrystalline region 1. A leakage current from the monocrystalline region 1 is very small due to the formation of the pn junction 18 in the monocrystalline region. Incidentally, reference numeral 7 denotes an n-type layer for cutting a channel, and a broken line 19 indicates a boundary between the monocrystalline and polycrystalline regions 1 and 12. The cathode electrode 3 made of Al and a gate electrode made of Al are extended on the upper surface of the semiconductor substrate across a junction $J_2$, and the anode electrode 2 made of Al is extended on the lower surface across a junction $J_1$. That is, each of these electrodes serves as a field plate which can mitigate the concentration of electric field generated in the vicinity of the surface when a forward or reverse voltage is applied, to enhance the breakdown voltage of the thyristor. As a result, the breakdown voltage of the thyristor in the IC device is determined by not by the surface structure but the breakdown voltage in the bulk of the monocrystalline region 1. The thyristor according to this embodiment has positive and negative breakdown voltages of 600 V, a rated current of 5 A, and a dV/dt capability of more than 1000 V/μs. Incidentally, in this embodiment, the thickness of the monocrystalline island is less than 50 μm, and the thickness of the semiconductor substrate is about 120 μm. The depth of each of the $p_E$- and $p_B$-layers is 25 μm, and the $n_B$-layer has a width of about 70 μm and a carrier concentration of $3 \times 10^{14}$ cm$^{-3}$. Further, the size of the substrate (namely, an Si chip) constituting the IC device is 2.8 mm×2.4 mm, and the size of the monocrystalline region 1 on the upper side (that is, at the surface where the lead wires are provided) is 2.4 mm×2.2 mm.

Next, explanation will be made on a method of fabricating the above embodiment with reference to FIG. 3.

Figure 3A:
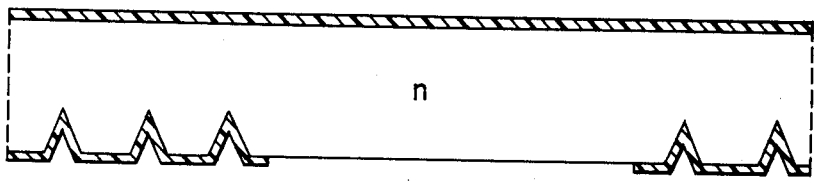
FIGS. 3A to 3D are sectional views for showing steps of a process of fabricating the semiconductor integrated circuit device shown in FIG. 2.
Figure 3B:
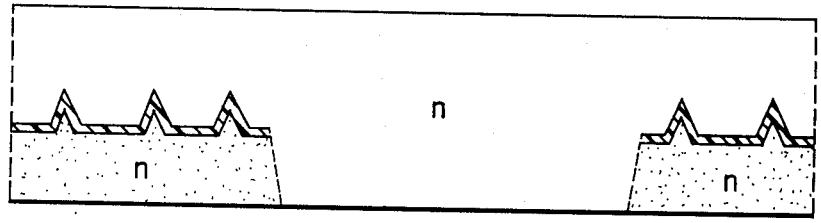
Figure 3C:
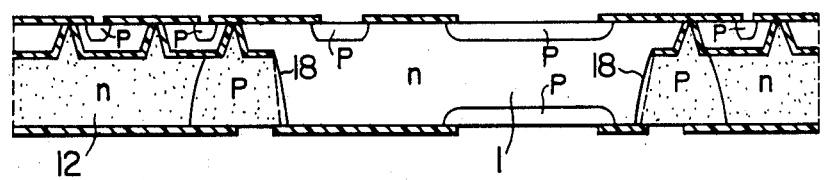
Figure 3D:
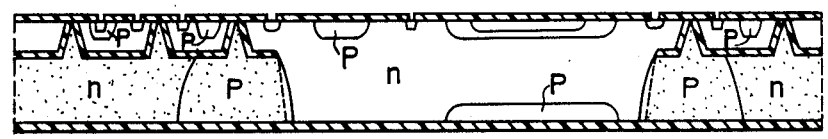

At first, an n-type silicon monocrystalline substrate, whose principal surfaces are parallel to a (100) plane and which has a carrier concentration of $1 \times 10^{14}$ cm$^{-3}$, is selectively etched to form isolating grooves. The substrate is then subjected to the first oxidation, and the oxide film formed on a surface portion corresponding to the monocrystalline region 1 is removed through a photoeching technique to obtain such a structure as shown in FIG. 3A. Next, silicon is deposited on the substrate through the vapor epitaxial growth method, and then the deposited silicon is lapped to obtain such a structure as shown in FIG. 3B. As is seen in FIG. 3B, the monocrystalline region is grown on the portion where the oxide film is removed, and the polycrystalline region is grown on other portions. The above semiconductor body is lapped at the side of substrate to have a predetermined thickness of 120 μm. Then, the body is subjected to the second oxidation, and the selective diffusion of boron is effected to form p-type layers. Thus, such a structure as shown in FIG. 3C is obtained. The diffusion velocity of boron in the polycrystalline region 12 is greater than that in the monocrystalline region 1 by about one order of magnitude. Accordingly, in a period when the p-type layers having a predetermined depth are formed in the monocrystalline region, boron is diffused in the polycrystalline region 12 to the isolating SiO$_2$ film, and is diffused from the polycrystalline region 12 into the monocrystalline region 1 to form a pn junction in the monocrystalline region 1. Next, the selective etching is conducted through a photoetching technique in the second oxide film and on a boron-doped silicon oxide film formed in the period when boron is diffused, to define apertures for diffusing phosphorus. Then, phosphorus is diffused through the apertures to form n-type layers. Thus, there is obtained such a structure as shown in FIG. 3D. The subsequent steps will be explained below without employing any figure. Apertures for forming Al contacts are provided through a photoetching technique, aluminum is deposited, and then an Al wiring pattern is formed through a photoetching technique. Subsequently, the chip is coated with the polyimide resin 15, and apertures for bonding the lead wires are provided in the polyimide resin film through a photoetching technique. The chip is then subject to dicing, and thus the chip portion of the device shown in FIG. 2 is obtained. Further, the above chip portion is fixed through the solder 4 to the heat sink 5 in a die bonding step, and then the lead wires are bonded at desired positions. Thus, the device shown in FIG. 2 is finished.

According to the present invention, the anode of the thyristor, which is a power element, is mounted on the heat sink through the solder which is a good conductor of heat. While, the dielectric isolated portion where the electric connection is effected with the ordinary lead bonding system, is thermally coupled through the isolating SiO$_2$ film, the polycrystalline region, the $n_B$-layer of thyristor and the solder with the heat sink, and further coupled with the lead pins through the lead wires. Accordingly, the heat resistance from the IC to the heat sink in the case of the present invention is about one fifth as low as that in a conventional dielectric isolated IC, and therefore a larger current can flow through the IC device according to the present invention as compared with the case of the conventional IC, with the same temperature rise at the heat sink and the pn junctions. For example, the heat resistance of the IC according to the present invention is less than one fifth of that of the conventional IC, when these IC's are mounted on a Cu heat sink having a size of 20 mm×10 mm×1.3 mm, and a mean current of 5 A can flow through the IC according to the present invention but the conventional IC is thermally damaged by the same current.

Further, since the thyristor of the present invention has the vertical structure, the on-state voltage thereof can be made smaller than that of a thyristor which is formed in a conventional dielectric isolated IC and has the same junction area. For example, the forward voltage drop (FVD) of the thyristor according to the present invention is less than 1.2 V when a current of 1 A flows through the thyristor, and the FVD of the conventional thyristor is more than 2.0 V under the same condition. This is thought to be based upon the fact that the thyristor according to the present invention is small in carrier loss at the bulk portion and is low in field concentration at the edge of the junction J$_3$ as compared with the lateral thyristor formed in the conventional dielectric isolated IC. Accordingly, when heat sinks of the same heat capacity are employed and the power loss is defined by a specified value, the IC device of the present invention can obtain a far larger current capacity as compared with the conventional IC device.

Further, since the thyristor of the present invention has the vertical structure, the $p_E$- and $n_E$-layers are formed in one and the other principal surfaces, respectively. As a result, a ratio of the surface area of the monocrystalline region, in which the thyristor is formed, to the surface area of chip is decreased by 20%, as compared with the case of the lateral thyristor.

Furthermore, according to the present invention, the thickness of each monocrystalline island, in which an element applied with a low voltage is formed, can be lowered. When the thyristor, whose $n_B$-layer has a carrier concentration of $3 \times 10^{14}$ cm$^{-3}$, is applied with 600 V, the width of the depletion layer formed in the bulk of the thyristor is nearly equal to 55 μm. In a conventional dielectric isolated IC, an n$^+$-layer is formed at the bottom of each monocrystalline island, in order to reduce the on-state voltage and the forward voltage drop (FVD) of a lateral element. Accordingly, in order that a thyristor formed in the monocrystalline island has a high breakdown voltage of 600 V, it is necessary to avoid the reach of the depletion layer to the n$^+$-layer. That is, it is required that the distance between the n$^+$-layer and a pn junction applied with a high voltage is made greater than 55 μm. In other words, the depth of the monocrystalline island had to be made greater than 80 μm, which is equal to the sum of the above distance, namely, 55 μm and the depth of the above junction, namely, 25 μm. Accordingly, the surface area of the monocrystalline island becomes greater than 114 μm×225 μm (namely, 2×80/tan 54.5° μm×2×80/tan 54.5° μm). A surface area of 60 μm×50 μm is quite enough for the monocrystalline islands 8 and 9, in which the diodes $D_1$ and $D_2$ are formed. Therefore, the monocrystalline island of the conventional IC is obliged to have a surface area which is far greater than a required value. On the contrary, in the IC device according to the present invention, the depth of each monocrystalline island in which an element applied with low voltage is formed, can be determined independently of the voltage applied to an element having a high breakdown voltage, and therefore the surface area of the monocrystalline island can be decreased to a required value. Thus, the chip size can be reduced.

The above effect is remarkable in such a case that a plurality of circuits each having the circuit arrangement shown in FIG. 1 are integrated in one chip, or a TTL logic circuit is further integrated in the same chip, that is, in a case that a single chip includes a large number of elements each having a low applied voltage and a small current capacity.

In the previously-mentioned method of fabricating the embodiment of the present invention, the elements applied with a low voltage and the element applied with a high voltage are formed by the same diffusion process. However, when the low-voltage elements are independently formed so as to have a shallow pn junction, the lateral width of diffusion region can be made smaller. Accordingly, the surface area of each monocrystalline island can be made for smaller. That is, the advantage obtained by reducing the depth of each monocrystalline island is further emphasized.

In the foregoing, one method of fabricating the embodiment of the present invention and one modification thereof have been explained. However, various methods are applicable to the fabrication of the embodiment. For example, the following method is effective in reducing the diffusion time required for forming the isolating p-type layer shown in FIG. 3C. That is, after the structure shown in FIG. 3A has been completed, a p-type layer which is highly doped with boron, is grown through the vapor epitaxial growth method, and then the p-type layer is etched away through a photoetching technique with a portion corresponding to the isolating p-type layer shown in FIG. 3C being left unetched. Subsequently, the n-type layer is grown through the vapor epitaxial growth method, and then the steps previously-described in connection with FIGS. 3B to 3D are conducted to fabricate the embodiment. According to this method, it is possible to greatly reduce the diffusion time required when the isolating p-type layer is formed by diffusion in the step shown in FIG. 3C. In more detail, acceptors contained in the p-type layer which is left unetched, are diffused into the n-type layer when the n-type layer is grown through the vapor phase epitaxy and when the isolating p-type layer is formed through the diffusion process. Thus, a part of the isolating p-type layer is formed by the acceptors in the highly doped p-type layer. For example, in a case where the substrate shown in FIG. 2 has a thickness of 120 μm and each monocrystalline island has a depth of 50 μm, the fabricating method shown in FIGS. 3A to 3D requires a diffusion distance in a range of 74 to 80 μm to form the isolating p-type layer, but the method making use of the highly doped p-type layer requires a diffusion distance in a range of 36 to 40 μm. Accordingly, the method employing the highly doped p-type layer can greatly shorten the diffusion time or reduce the diffusion temperature.

Now, explanation will be made on an embodiment of the present invention including a field effect thyristor and a TTL circuit with reference to FIGS. 4 and 5.

Figure 4:
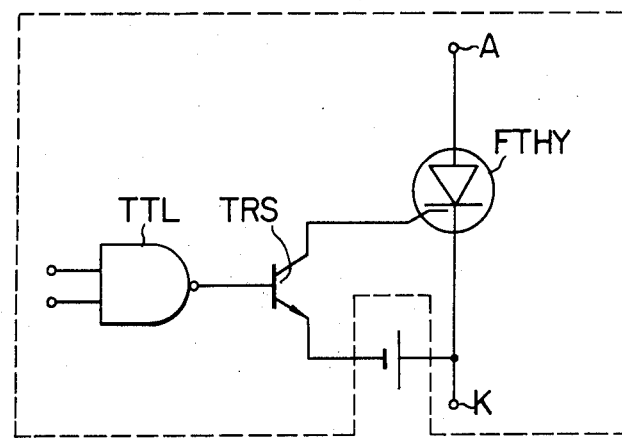
FIG. 4 is a circuit diagram of a TTL circuit employing a field effect thyristor.

In FIG. 4, reference symbol FTHY denotes a field effect thyristor, the fundamental structure and operational principle of which are disclosed in a Japanese Patent Application Laid-open No. 12987/75 and in IEEE Trans. Electron Device Vol. ED-23, No. 8, 1976, page 905. The operation of the field effect thyristor FTHY is as follows: when the output of a logic current TTL is put in the level of "1" and a transistor TRS is put in the on-state, the field effect thyristor FTHY is put in the off-state; when the output of the logic circuit TTL is put in the level of "0" and the transistor TRS is put in the offstate, the field effect thyristor FTHY is put in the on-state.

Figure 5:
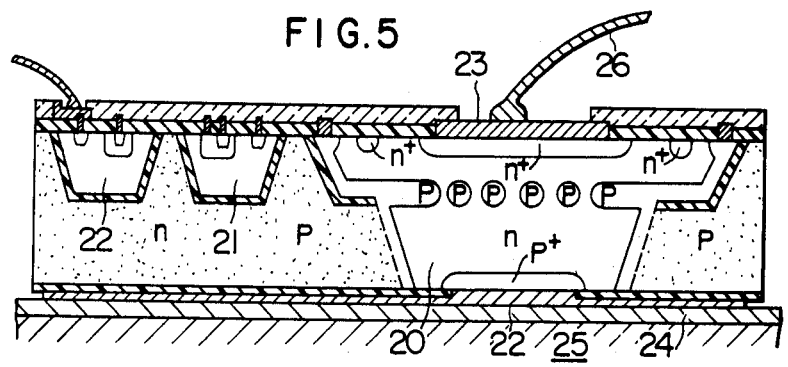
FIG. 5 is a longitudinal sectional view of a semiconductor integrated circuit device in which the TTL circuit shown in FIG. 4 is formed in accordance with the present invention.

Referring to FIG. 5, the field effect thyristor FTHY having a breakdown voltage of 600 V and a current capacity of 5 A is formed in a monocrystalline region 20, and the transsistor TRS and the logic circuit TTL are formed in monocrystalline islands 21 and 22, respectively. The monocrystalline region 20 has a thickness of 200 μm, and each monocrystalline island has a depth of 40 μm. An anode electrode 22 of the thyristor FTHY is coupled through a solder 24 with a heat sink 25, and a cathode electrode 23 is connected through a lead wire 26 to a lead pin (not shown). Since the thyristor FTHY is formed as a vertical-structure element and is connected directly with the heat sink 25, it is low in heat resistance and can bear a large current. Further, since the monocrystalline islands, in each of which the transistor TRS or logic circuit is formed, can be made shallow independently of the breakdown voltage of the thyristor, the packing density can be enhanced.

Figure 6:
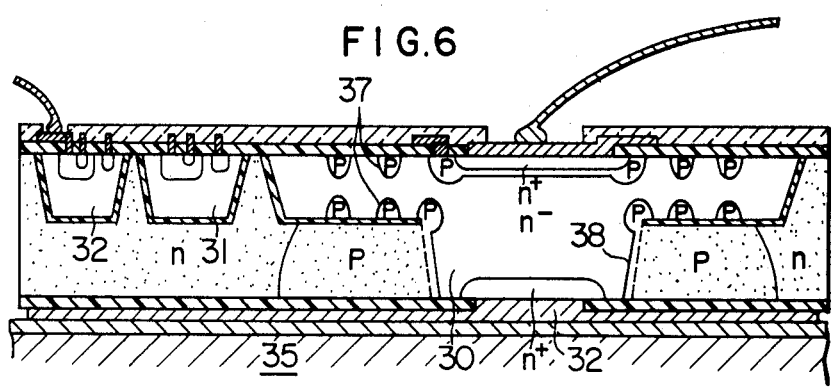
FIG. 6 is a longitudinal sectional view of a semiconductor integrated circuit device according to another embodiment of the present invention.

FIG. 6 shows another embodiment of the present invention, in which a transistor having a high breakdown voltage, a driving transistor thereof and a logic circuit are formed in a monocrystalline region 30 and monocrystalline islands 31 and 32, respectively. The high-voltage transistor has a breakdown voltage of 1000 V and a current capacity of 3A. In order to achieve such a high breakdown voltage, a field plate is provided above the junction between the base and the collector to reduce the concentration of electric field in the surface, and field limiting rings 37 are provided to reduce the concentration of electric field in the surface and bulk. A collector electrode 32 is coupled directly with a heat sink 35 as do the anode electrodes of the embodiments shown in FIGS. 2 and 5, and therefore the high-voltage transistor of the embodiment is low in heat resistance and can bear a large current. Further, the depletion layer is extended into the n-type layer by the field limiting rings 37 and an isolating pn junction 38 to reduce the electric field intensity, so that the breakdown voltage can be made high. Furthermore, since the depth of the monocrystalline islands 31 and 32 can be made smaller than the width of depletion layer at a time when the high-voltage transistor is applied with 1,000 V, the packing density can be enhanced. For example, the thickness of the monocrystalline region 30 is 170 μm, and the depth of the monocrystalline islands 31 and 32 is 60 μm.

The devices shown in FIGS. 5 and 6 can be readily fabricated by changing in some degree the fabricating process of the device shown in FIG. 2. In more detail, the main structural difference between the devices shown in FIGS. 5 and 6 and the device shown in FIG. 2 resides in that the thyristor of FIG. 5 or 6 includes gate regions at the step portion and in the bulk thereof and field limiting rings 37 at the step portion thereof. The gate regions and field limiting rings can be fabricated in the following manner. In the fabricating process of the device shown in FIG. 2, the substrate which has been subjected to the first oxidation after the formation of isolating grooves, is etched through a photoetching technique to conduct the selective diffusion of a p-type impurity (for example, boron), and then the same process as the fabricating process of the device shown in FIG. 2 is carried out.

Figure 7:
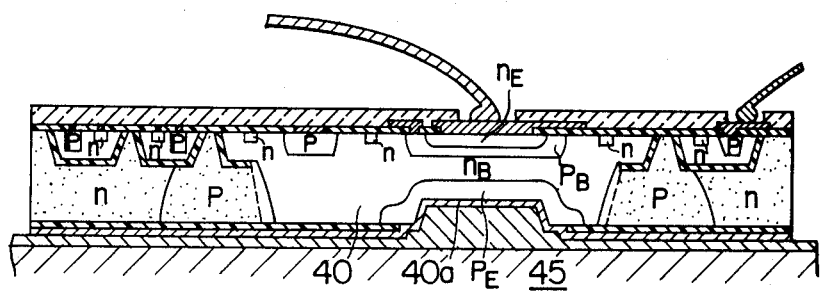
FIG. 7 is a longitudinal sectional view of a semiconductor integrated circuit device according to a further embodiment of the present invention.

FIG. 7 shows a further embodiment of the present invention. When it is required to adjust the vertical dimensions of the thyristor shown in FIG. 2 in order to obtain a desired characteristic, the smallest thickness (for example, 100 μm) of the thyristor is often determined from a standpoint of handling. In such cases, the depth of the diffused p-type layer has to be made greater to obtain the $n_B$-layer having a desired width. This is contradictory to the feature of the present invention that the diffused layer is made shallow to enhance the packing density. According to the structure shown in FIG. 7, the above problem can be solved, and the degree of freedom in the vertical dimensions is greatly enhanced.

Referring to FIG. 7, a recess 40a is provided in that principal surface of a monocrystalline region 40 which is coupled with a stem 45, and a convex $p_E$-layer is formed by the diffusion from the recess. The recess is preferably fabricated through anisotropic etching techniques. In this embodiment, the $n_B$-layer having a desired width is obtained by changing the depth of the recess. For example, in a preferred embodiment, the thickness of the chip, the depth of the recess, and the diffusion depth from each principal surface are made equal to 160, 50 and 25 μm, respectively. Thus, the $n_B$-layer having a width of about 60 μm is obtained.

It is to be noted that the present invention is not limited to the above-mentioned embodiments and modifications but is applicable to various cases. For example, various kinds of elements other than the thyristor can be used as the high-power element, and the thickness of the chip can be appropriately selected in accordance with the characteristic of each element.

Although, in the foregoing description, only a single power element is included in a dielectric isolated substrate, the substrate can include a plurality of power elements by providing a number of monocrystalline regions.

As has been explained hereinbefore, according to the present invention, a vertical-structure element and a planar or lateral element are incorporated in one to form a monolithic IC, and therefore the breakdown voltage and the current capacity can be increased, and the packing density can be enhanced.

What is claimed is:

1. A semiconductor integrated circuit device comprising:
    a semiconductor polycrystalline substrate having first and second principal surfaces on opposite sides of said polycrystalline substrate;
    a semiconductor monocrystalline region formed in said semiconductor polycrystalline substrate to extend from the first principal surface of said substrate to the second principal surface thereof, said semiconductor monocrystalline region having a first principal surface formed in the first principal surface of said polycrystalline substrate and a second principal surface formed in the second principal surface of the polycrystalline substrate;
    at least one semiconductor monocrystalline island formed in said semiconductor polycrystalline substrate adjacent to said monocrystalline region, said at least one monocrystalline island having a principal surface formed in said first principal surface of said polycrystalline substrate; and
    a dielectric film formed between said at least one semiconductor monocrystalline island and said semiconductor polycrystalline substrate to isolate said at least one semiconductor monocrystalline island from said polycrystalline substrate and said monocrystalline region.

2. A semiconductor integrated circuit device according to claim 1, wherein said device includes a plurality of said monocrystalline islands each of which has a dielectric film formed between itself and said polycrystalline substrate so that said plurality of monocrystalline islands are isolated from one another.

3. A semiconductor integrated circuit device according to claim 2, wherein one portion of said semiconductor monocrystalline region is isolated from said semiconductor polycrystalline substrate by a dielectric film which extends from said first principal surface of said polycrystalline substrate to a predetermined depth in said polycrystalline substrate toward said second principal surface of said substrate, and a second portion of said monocrystalline region is separated from said polycrystalline substrate by a pn junction which extends in said polycrystalline substrate from said second principal surface of said substrate to a depth in said substrate where it abuts to said dielectric film which isolates said first portion of said monocrystalline region.

4. A semiconductor integrated circuit device according to claim 1, wherein the vertical-structure element comprises a 4-layer semiconductor device having a cathode formed in the first principal surface of the monocrystalline region and an anode formed in the second principal surface of the monocrystalline region.

5. A semiconductor integrated circuit device according to claim 2, wherein said second principal surfaces of said polycrystalline substrate and said monocrystalline region are fixed to a heat sink through a solder layer.

6. A semiconductor integrated circuit device according to claim 2, wherein a power element is formed in said semiconductor monocrystalline region, and a circuit element for controlling said power element is formed in each of said semiconductor monocrystalline islands.

7. A semiconductor integrated circuit device according to claim 2, wherein a vertical-structure element is formed in said semiconductor monocrystalline region, and a lateral element is formed in each of said semiconductor monocrystalline islands.

8. A semiconductor integrated circuit device according to claim 2, wherein a recess is provided in at least a part of said second principal surface of said semiconductor monocrystalline region.

9. A semiconductor integrated circuit device according to claim 2, wherein one portion of said semiconductor monocrystalline region is isolated from said semiconductor polycrystalline substrate by dielectric film while another portion of said monocrystalline region is isolated from said polycrystalline substrate by a pn junction.

* * * * *